United States Patent [19]

Geiseler

[11] 4,186,280

[45] Jan. 29, 1980

[54] METHOD AND APPARATUS FOR RESTORING AGED SOUND RECORDINGS

[75] Inventor: Wolfgang Geiseler, Berlin, Fed. Rep. of Germany

[73] Assignee: CMB Colonia Management-und Beratungsgesellschaft mbH & Co. KG, Cologne, Fed. Rep. of Germany

[21] Appl. No.: 791,573

[22] Filed: Apr. 27, 1977

[30] Foreign Application Priority Data

Apr. 29, 1976 [DE] Fed. Rep. of Germany ....... 2618973

[51] Int. Cl.$^2$ .......................... G11B 5/04; G10H 1/02
[52] U.S. Cl. ............................... 179/100.1 R; 84/1.19
[58] Field of Search ................. 179/100.1 R, 100.1 D, 179/1 J, 1 D, 1 P, 1 R, 100.4 C, 100.4 ST; 84/DIG. 9, DIG. 11, 1.01, 1.19, 1.21, 1.22, 1.24; 360/24, 25

[56] References Cited

U.S. PATENT DOCUMENTS

| | | | |
|---|---|---|---|
| 2,808,466 | 10/1957 | Olson et al. | 179/100.1 R |
| 2,999,905 | 9/1961 | Malinaric | 179/100.1 R |
| 3,286,248 | 11/1966 | Koss | 179/100.1 R |
| 3,379,839 | 5/1968 | Bennett | 179/100.1 R |
| 3,688,010 | 8/1972 | Freeman | 84/1.19 |
| 3,719,782 | 3/1973 | Barnum | 179/1 J |
| 3,956,960 | 5/1976 | Deutsch | 84/1.19 |
| 4,101,840 | 7/1978 | Fricke et al. | 179/1 M |

*Primary Examiner*—Daryl W. Cook
*Attorney, Agent, or Firm*—Frishauf, Holtz, Goodman & Woodward

[57] ABSTRACT

The specification describes the restoration of old sound recordings. Old recordings, e.g. phonograph records or tape recordings having at least one substantial musical part such as a singing voice, a solo-instrument or the like, with a formant character, are restored by playing back with the production of an electrical acoustic signal. The amplitude of the acoustic signal is enhanced in frequency ranges which correspond to the formants of the significant musical part.

9 Claims, 1 Drawing Figure

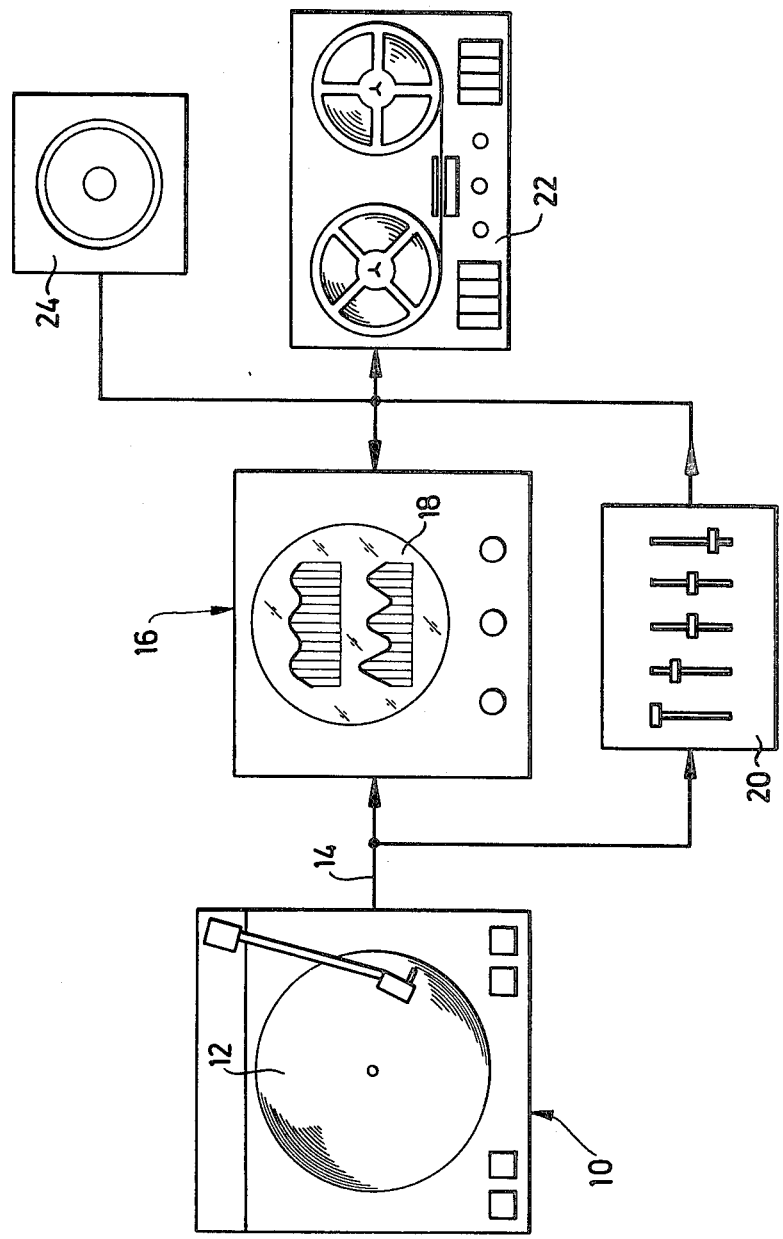

METHOD AND APPARATUS FOR RESTORING AGED SOUND RECORDINGS

REFERENCE TO PUBLICATIONS OF PATENT APPLICATIONS PERTINENT TO THE INVENTION

German patent specification (Offenlegungsschrift) No. 2,050,220
"Funktechnik" 1974, No. 1, page 24;
"Funktechnik" 1974, No. 7, pages 227 to 229;
"Funktechnik" 1974, No. 9, pages 323 to 325;
U.S. Pat. No. 4,101,840;
U.S. Pat. Nos. 2,235,249 and 3,719,782.

The present invention relates to signal processing to restore the sound versions of old sound recordings.

BACKGROUND AND PRIOR ART

The German patent specification No. 2,050,220 describes a music instrument which is provided with mechanical or electroacoustic resonators in order to emphasize the formant intervals characteristic for the timbre of its sound.

On page 24 of issue No. 1 of "Funktechnik" 1974 there is a description of a fourpole for the conversion of white noise to pink noise while on pages 227 to 229 in issue No. 7 there is a description of a method of measurement for determining the trackability of sound pickups in which frequency analyzers are used. "Pink noise" is here defined as noise in for thirds which the energy level for tierces), or octaves, respectively, remains constant independently of the frequency, so that a frequency-independent source is obtained. On pages 323 to 325 of issue of No. 9 of the same year there is a description of calibrating phonograph records for the rapid termination of the characteristics and for checking the tracking properties of stereo pick-ups, together with a measurement circuit for determining the distortions.

U.S. Pat. No. 4,101,840 describes a circuit arrangement with a varying degree of response or transmission in the case of which the middle frequency of formant-like maxima of the amplitude/frequency curve of the transmission response is slightly changed in accordance with the volume or loudness setting and/or the amplitude ratio of the formant-like maxima is changed with the loudness setting.

The U.S. Pat. Nos. 2,235,249 and 3,719,782 describe methods and apparatus for acoustic control for electroacoustic play-back systems.

In the phonograph and tape recorder industry there is a substantial interest to restore old recordings, that is to say both in the case of sung performances and also in the case of instrumental and orchestra recordings. A certain improvement in the acoustic quality of old sound recordings can be achieved by suppression of and compensation for noise in the upper frequency ranges; however the results are by and large not always satisfactory and in particular it has so far only been possible to overcome the effects of wear, which more particularly impair the forte passages of the middle and higher pitch ranges, to a limited extent.

THE INVENTION

It is an object to provide an improved method to restore old sound recordings, particularly those having vocal or solo instrument presentations.

Briefly the sound recording may be, for example a phonograph record or a tape recording which has at least one significant musical part, corresponding for example to one singing voice two dissimilar voices, a solo instrument or the like, or two dissimilar instruments, with a formant character. The sound recording is conventionally played back with the production of an electrical acoustic signal. In accordance with the invention the amplitude of the acoustic signal is enhanced in frequency ranges which correspond to the formant ranges of a significant musical part. The acoustic signal can be then transmitted audibly, for example by means of a loudspeaker or used for the production of a restored sound recording.

The frequency of the formant ranges in the case of conventional musical instruments such as wind and string instruments played with a bow and usually in the case of a singing voice, is substantially independent of the pitch. The method in accordance with the invention can therefore be used to enhance or stress an instrument or singing voice as compared with the upper parts of the acoustic signal mixture without it being necessary for this purpose to provide any adaptation to the respective pitch of the sound of the musical part (as for example a solo instrument) which is to be emphasized or enhanced.

Even in the case of very faded and substantially worn sound recordings it is possible to use the method in accordance with the invention to produce a substantial improvement in the general acoustic impression by determining the typical formant characters for the significant and readily noticeable sound sources or parts (solo voices, solo instrument, predominant instrumental group and the like) and then enhancing the formant characters, that is to say for example by selective amplification or filtration out of the acoustic signal mixture, following which the formant characters are separately processed and then returned to the acoustic signal mixture, which if required may have been processed separately as regards noise and the like.

In the case of a first embodiment of the method in accordance with the invention those frequency ranges are determined, in which the formants of the significant musical part or parts or acoustic sources are located and the acoustic signal is then selectively amplified in these frequency ranges.

In the case of another embodiment of the invention the frequency ranges of the formants of interest are again determined and from the acoustic signal mixture a signal consisting chiefly of this frequency ranges is separated off. The separated signal and the signal mixture (which can also comprise the separated signal but does not need to comprise it) are then separately prepared or processed as for example by being freed of noise, amplified and then put together again in such a manner that the formant ranges are enhanced with respect to the remaining frequency components, that is to say have somewhat greater amplitudes than originally was the case.

The regenerated signals attained in this manner can also be reproduced by an electro-acoustic device as an audible signal, modulated on to a high frequency carrier for broadcasting or recorded again for producing a regenerated sound recording and if necessary the sound recording can be copied.

In the accompanying drawing a device for performing the method in accordance with the invention is represented diagrammatically.

DESCRIPTION OF PREFERRED EMBODIMENT

The device represented by way of example comprises a record player 10 for play-back of an old phonograph record 12, from which a restored recording is so be prepared. The record player 10 provides an electric acoustic signal at an output line 14 and this signal is supplied either directly or after intermediate storage on a magnetic tape (not shown) to an acoustic spectrograph 16, which by means of a cathode ray tube 18 displays the instantaneous acoustic spectrum. The cathode ray tube 18 can preferably be part of a storage oscillograph so that the instantaneous amplitude frequency distribution of the played acoustic signal can be selected and stored at a specific instant. The acoustic signal is furthermore fed to an amplifier 20, which comprises a filter arrangement, which makes it possible to carry out selective setting of the frequency response of the amplifier in a series of adjacent relatively narrow ranges. The amplifier filter unit 20 is preferably constructed in accordance with the principle of the U.S. application Ser. No. 691,639, now U.S. Pat. No. 4,101,840 supra. The output terminal of the amplifier filter unit 20 is for example connected with a tape recorder 22 in which the regenerated acoustic signal is recorded for play back or for further processing. The output signal of the amplifier filter unit can furthermore be supplied to the acoustic spectrograph 16 in order to be able to monitor the result of filtration. The acoustic spectrograph can for this purpose be arranged to have its input connected selectively with the output of the record player 10 or the output of the amplifier filter unit 20 or can be constructed as a double-spectrograph for the simultaneous presentation of the non-restored or the restored signal.

If the position of the formant ranges of the significant muscial part are not already known for operation of the device shown firstly the phonograph record 12 is firstly played for monitoring and is heard by means of a loudspeaker 24 or the like connected with another output of the amplifier filter unit 20. The amplifier filter unit 20 is in this case so set that a flat frequency response is achieved. A position is now determined where the significant musical part or the significant voice at least concealed by other sounds and then, using the acoustic spectrograph 16, the position of the formant range or ranges of the significant part. On the basis of the acoustic spectrum determined in this manner in respect of the significant voice or the significant musical part the frequency response of the amplifier and filter unit 20 is so set that the formant or the formants of the significant voice or the significant instrument part is enhanced in relation to the other frequency ranges.

When the sound recording to be restored comprises several musical parts which are to be restored the method is carried out separately for each musical part individually and the acoustic signals with the regenerated musical parts are then combined to form a regenerated sound recording possibly, if necessary, after removing noise or carrying out some other known processing operation.

The formant-regions of a number conventionel musical instruments are disclosed in a book.

Paul Heinrich Mertens: Die Schumannschen Klangfarbengesetze und ihre Bedeutung für die Übertragung von Sprache und Musik Verlag: E. Bochinsky, 1975, Frankfurt/Main.

I claim:

1. A method for preparing a restored sound version from an old sound recording having at least one significant musical part forming at least one of: singing voice; solo instrument; predominant instrumental group; said significant musical part having a formant character, comprising
    playing back the old sound recording;
    generating an electric audio signal;
    frequency-selectively processing the electric audio signal in a circuit arrangement with a preestablished frequency response;
    enhancing the amplitude of at least one formant frequency range or portion of a specific selected significant musical part of the audio signal by amplifying said at least one formant frequency range or part and corresponding to said selected significant musical part by a factor other than the amplitude of a non-formant portion of the audio signal corresponding to said musical part, said steps of frequency selectively processing the signal and enhancing the amplitude of at least one formant frequency range or portion comprising separately enhancing the amplitude of separate formant frequency ranges or portions of the specific selected significant musical part by amplifying the signal selectively with respect to the separate formant frequency ranges or portions inherent in the specific selected significant musical part by selected factors other than the amplitude of the non-formant portion of the audio signal;
    and combining said separately processed signals to form a regenerated audio signal.

2. Method according to claim 1, wherein the formant signal portion and the audio signal are separately processed.

3. Method according to claim 2, wherein the separately processed signals are processed to affect noise reduction and amplification;
    and further including the step of combining the so processed separate signals.

4. Method according to claim 1, further comprising the step of re-recording the audio signal resulting after said processing step.

5. Method according to claim 4, including the step of re-copying the re-recorded signal.

6. Method according to claim 1, including the step of displaying the frequency—amplitude relationship of the electric audio signal derived from said playback step; and displaying the frequency—amplitude relationship of the audio signal after the enhancement step to permit comparison of said displayed relationships and adjustment of the degree of enhancement.

7. Apparatus to prepare a restored sound version from an old sound recording having at least one significant musical part forming at least one of: singing voice; solo instrument; predominant instrument group; said part having a formant character, comprising
    reproducing transducer means (10) to play back a sound recording (12) from which the restored recording is to be produced;
    amplifier-filter circuit means (20) connected to and having the transduced signal from said transducer means (10) applied thereto and to process said so transduced signals with respect to frequency selection and selective amplification corresponding to the formant character of a selected significant musical;

indicating means (16) connected to and controlled by said transducer means (10) and indicating the frequency distribution of the audio signal transduced from said recording (12) by said transducer means, the frequency selective amplifier means (20) being adjusted to provide a prepared sound signal in which the formant ranges or portions of the selected significant part of the sound recording are enhanced with respect to the amplitude of non-formant portions of the audio signal in accordance with the indicated frequency-amplitude relationships on said indicating means;

and output means (22, 24) connected to said frequency selective filter and amplifier means for storage or transmission of said processed signals.

8. Apparatus according to claim 7, wherein the frequency selective filter-amplifier means (20) comprises a loudness setting stage having a frequency selective means which has an amplitude/frequency characteristic with at least one maximum lying in the audible frequency range and corresponding to the path range of a band filter;

and means for changing the frequency of maximum amplifier gain in accordance with frequency, to frequency-selectively control the enhancement of a selected portion of said signal.

9. Apparatus according to claim 7, including feedback means connected from the output of said frequency-selective filter-amplifier means (20) to said indicator means (16) to permit simultaneous indication of the signal derived from said transducer means and representative of the old recording and the formant-enhanced signal, processed after processing in said filter-amplifier means (20) to permit selective readjustment and changing of the frequency and amplitude relationships in said frequency-selective filter-amplifier means.

* * * * *